US007474134B2

(12) United States Patent
Mo

(10) Patent No.: US 7,474,134 B2
(45) Date of Patent: Jan. 6, 2009

(54) RADIATION HARDENED PROGRAMMABLE PHASE FREQUENCY DIVIDER

(75) Inventor: William Yeh-Yung Mo, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/923,900

(22) Filed: Oct. 25, 2007

(65) Prior Publication Data

US 2008/0048745 A1 Feb. 28, 2008

Related U.S. Application Data

(63) Continuation-in-part of application No. 11/419,008, filed on May 18, 2006, now Pat. No. 7,362,154.

(51) Int. Cl.
*H03K 21/00* (2006.01)

(52) U.S. Cl. ...................... 327/117; 327/115

(58) Field of Classification Search ......... 327/113–115, 327/117; 377/47, 48
See application file for complete search history.

(56) References Cited

U.S. PATENT DOCUMENTS

| 5,049,760 | A | 9/1991 | Ooms |
| 5,576,644 | A | 11/1996 | Pelella |
| 5,844,437 | A | 12/1998 | Asazawa et al. |
| 5,892,382 | A | 4/1999 | Ueda et al. |
| 5,945,858 | A | * | 8/1999 | Sato ........................... 327/202 |
| 6,163,189 | A | | 12/2000 | Ogawa |
| 6,268,752 | B1 | | 7/2001 | Takahashi et al. |
| 6,522,711 | B2 | * | 2/2003 | Wakada et al. ................. 377/48 |
| 6,696,870 | B2 | * | 2/2004 | Dellow ........................ 327/115 |
| 6,696,873 | B2 | | 2/2004 | Hazucha et al. |
| 6,831,489 | B2 | * | 12/2004 | Cheung et al. .............. 327/115 |
| 6,847,239 | B2 | * | 1/2005 | Leifso et al. ................. 327/117 |
| 6,909,637 | B2 | | 6/2005 | Nelson et al. |
| 7,009,438 | B2 | | 3/2006 | Pullela et al. |
| 7,084,683 | B1 | | 8/2006 | Nix |
| 7,161,404 | B2 | | 1/2007 | Hazucha et al. |
| 7,212,056 | B1 | | 5/2007 | Belov |
| 7,362,154 | B2 | * | 4/2008 | Mo ............................. 327/203 |
| 2003/0030474 | A1 | * | 2/2003 | McGowan ................... 327/202 |

* cited by examiner

*Primary Examiner*—Kenneth B. Wells
*Assistant Examiner*—Hai L. Nguyen
(74) *Attorney, Agent, or Firm*—Rabin & Berdo, PC

(57) ABSTRACT

The present invention provides a programmable phase frequency divider circuit implemented in CMOS technology for space applications. The programmable phase frequency divider consists of three radiation hardened D-type flip flops and combinational logic circuits to provide the feedback controls that allow programmable frequency division ratios from 1 to 8. The radiation hardened D-type flip flop circuits are designed to keep on running properly at GHz frequencies even after a single event upset (SEU) hit. The novel D-type flip flop circuits each have two pairs of complementary inputs and outputs to mitigate SEU's. The combinational logic circuits are designed to utilize the complementary outputs in such a way that only one of the four dual complementary inputs to any D-type flip flop gets flipped at most after an SEU hit.

6 Claims, 6 Drawing Sheets

RADIATION HARDENED PROGRAMMABLE PHASE FREQUENCY DIVIDER

This application is a continuation-in-part of pending U.S. patent application Ser. No. 11/419,008, filed May 18, 2006 and claims the benefit thereof.

BACKGROUND OF THE INVENTION

1. Field of the Invention

The invention relates to a radiation hardened programmable phase frequency divider for implementation in deep submicron CMOS technology, and particularly to a design structure embodied in a machine readable medium for designing, manufacturing and/or testing the radiation hardened programmable phase frequency divider circuit.

2. Background Information

CMOS circuits used in space applications are subject to single event upsets (SEU's) as a result of exposure to radiation consisting of alpha particles or neutrons. The charge induced by a single SEU hit can be as high as 1 picoCoulomb (pC), and can have a 2 miliAmpere (mA) amplitude with a 1 nanosecond (ns) period. When a programmable phase frequency divider (PPFD) used in such a space application is running at a frequency lower than 200 Megahertz (MHz), an SEU hit with 1 pC charge may not always cause a soft error if the timing of the SEU does not fall within the window for the set and hold times of any of the flip flops in the PPFD. In such case, a dual interlocked cell (DICE) type flip flop design, such as the one described in Weizhong Wang and Haiyan Gong, "Sense Amplifier Based RADHARD Flip Flop Design," IEEE Transactions on Nuclear Science, Vol. 51, No. 6 (December 2004), may be used. However, a PPFD fabricated in deep micron technology can run at frequencies in the Gigahertz (GHZ) range. In this case, the vulnerable timing window for set and hold of the PPFD's D-type flip flops (DFF's) will always be covered by the typical 1 ns period of an SEU hit. Under these circumstances, what is required is an innovative radiation hardening technique to ensure that the PPFD continues to function properly in a radiation environment.

SUMMARY OF THE INVENTION

In a first aspect of the invention, a radiation hardened master latch includes: a first master latch half circuit having a clock input, first and second complementary data inputs, complementary feedback inputs and complementary data outputs; and a second master latch half circuit identical to the first master latch half circuit and having a clock input, first and second complementary data inputs, complementary feedback inputs and complementary data outputs. In the master latch, the respective clock inputs of the first and second master latch half circuits are connected together in parallel; the respective first and second complementary data inputs of the first and second master latch half circuits are connected together in parallel; the complementary data outputs of the first master latch half circuit are cross connected to the complementary feedback inputs of the second master latch half circuit; and the complementary data outputs of the second master latch half circuit are cross connected to the complementary feedback inputs of the first master latch half circuit. In the absence of SEU's, the first and second complementary data inputs to the master latch have nominally the same input voltage levels. Operation of the master latch is immune to a single event upset affecting at most one of the four complementary data inputs to the master latch. The master latch half circuits are preferably implemented in CMOS technology capable of operating at GHz frequencies.

In another aspect of the invention, a radiation hardened slave latch includes: a first slave latch half circuit having first and second complementary data inputs, complementary feedback inputs and complementary data outputs; and a second slave latch half circuit identical to the first slave latch half circuit and having first and second complementary data inputs, complementary feedback inputs and complementary data outputs. In the slave latch, the first complementary data inputs of the first slave latch half circuit and the second complementary data inputs of the second slave latch half circuit are connected together in parallel; the second complementary data inputs of the first slave latch half circuit and the first complementary data inputs of the second slave latch half circuit are connected together in parallel; the complementary data outputs of the first slave latch half circuit are cross connected to the complementary feedback inputs of the second master latch half circuit; and the complementary data outputs of the second master latch half circuit are cross connected to the complementary feedback inputs of the first master latch half circuit. In the absence of SEU'S, the first and second complementary data inputs to the slave latch have nominally the same input voltage levels. Operation of the slave latch is immune to a single event upset affecting at most one of the four complementary data inputs to the slave latch. The slave latch half circuits are preferably implemented in CMOS technology capable of operating at GHz frequencies.

In yet another aspect of the invention, a radiation hardened D-type flip flop includes: a master latch, as described above, having a clock input, first and second complementary data inputs, and first and second complementary data outputs; and a slave latch, as described above, having first and second complementary data inputs, and first and second complementary data outputs. In the D-type flip flop, the first complementary data outputs of the master latch are connected to the first complementary data inputs of the slave latch, and the first complementary data outputs of the master latch are connected to the first complementary data inputs of the slave latch. In the absence of SEU's, the first and second complementary data inputs to the D-type flip flop have nominally the same input voltage levels. Operation of the D-type flip flop is immune to a single event upset affecting at most one of the four complementary data inputs to the slave latch. The master latch and slave latch circuits are preferably implemented in CMOS technology capable of operating at GHz frequencies.

In a further aspect of the invention, a radiation hardened programmable phase frequency divider is comprised of: a plurality of D-type flip flops, as described above, each having a clock input, first and second complementary data inputs, and first and second complementary data outputs; a first combinational logic block connected to the first complementary data inputs and the first complementary data outputs of the plurality of D-type flip flops; and a second combinational logic block identical to the first combinational logic block, and connected to the second complementary data inputs and the second complementary data outputs of the plurality of D-type flip flops. The clock inputs of the plurality of D-type flip flops are connected to a common clock source. The first and second combinational logic blocks are adapted to provide for frequency division of the clock source in accordance with a division number inputted to the combinational logic blocks. The inventive programmable phase frequency divider also preferably includes a third combinational logic block connected to the first combinational logic block for outputting a pulse train representing the clock source frequency divided in accordance with the division number. The plurality of D-type flip flops and the combinational logic blocks are preferably implemented in CMOS technology capable of operating at GHz frequencies.

In yet a further aspect of the invention, the radiation hardened programmable phase frequency divider resides in a design structure embodied in a machine readable medium storing information for designing, manufacturing and/or testing the programmable phase frequency divider circuit. The design structure may comprise a netlist which describes the programmable phase frequency divider circuit. The design structure may also reside on the machine readable medium as a data format used for the exchange of layout data for integrated circuits. Further, the design structure may include test data files, characterization data, verification data and/or design specifications.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

The present invention is directed to a radiation hardened (RADHARD) programmable phase frequency divider designed to be implemented in deep submicron CMOS technology.

In a preferred embodiment, a PPFD consists of 3 RADHARD D-type flip flops (DFF's) and combinational logic circuits to provide the feedback controls that allow programmable frequency division ratios from 1 to 8. The RADHARD DFF circuits are designed to keep on running properly at GHz frequencies even after a SEU hit. The novel DFF circuits each have two pairs of complementary inputs and outputs to mitigate single event upsets. The combinational logics are designed to utilize the complementary outputs in such a way that only one of two pairs of complementary inputs to any DFF gets flipped at most after an SEU hit. Therefore, a RADHARD PPFD that is immune to SEU's is achieved. A detailed description of the preferred embodiment follows.

Radhard Flip Flop Design

Figure 1:
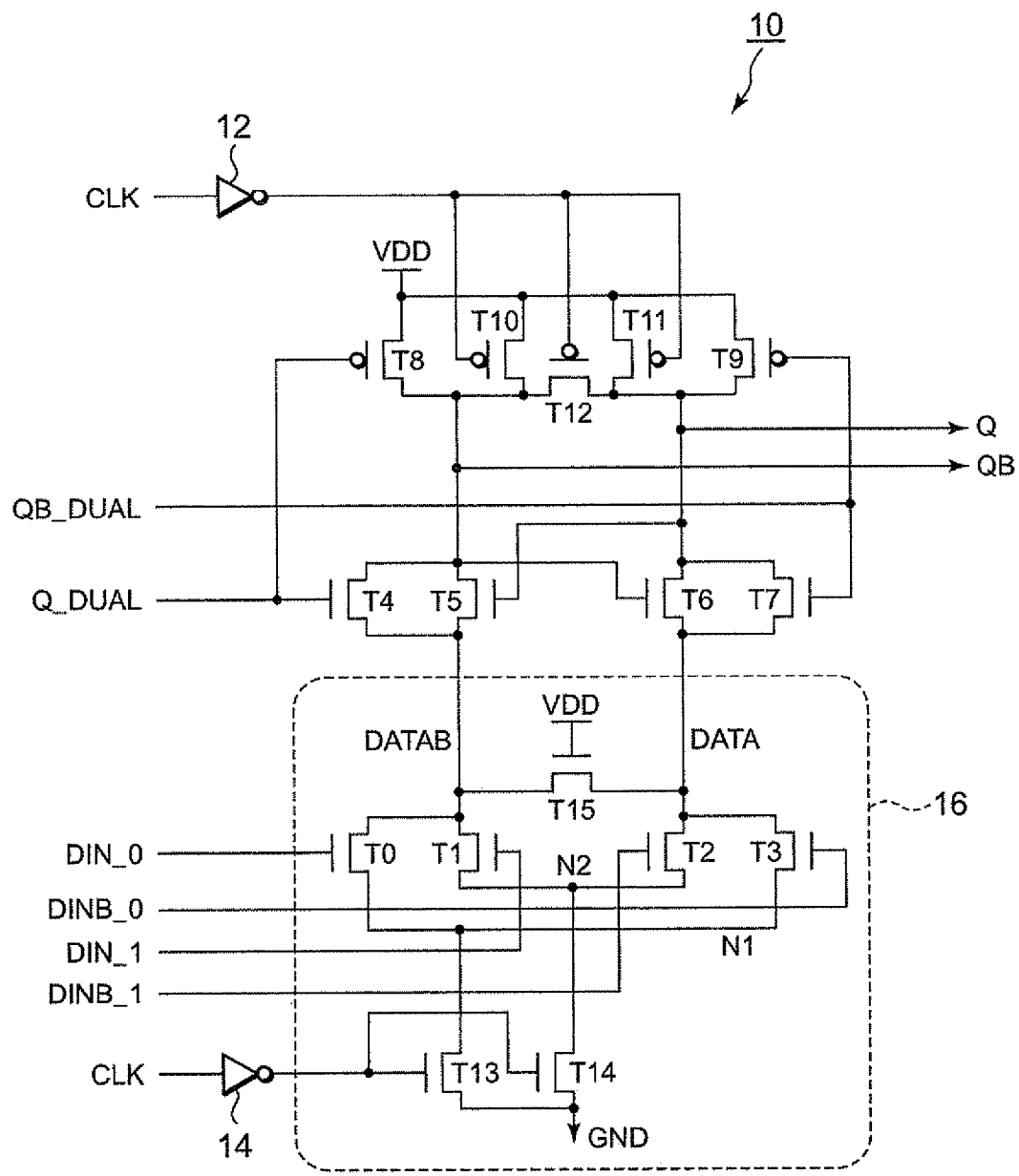
FIG. 1 is a schematic diagram of one half of a radiation hardened master latch according to the present invention.

FIG. 1 shows in schematic form the design of one half of a RADHARD master latch 10 according to the present invention. DIN_0, DINB_0 and DIN_1, DINB_1 are dual complementary data inputs. Q and QB are complementary data outputs. Q_DUAL and QB_DUAL are complementary feedback inputs from the other half circuit comprising the RADHARD master latch (see FIG. 2). CLK is the clock input. Voltage source VDD provides power to the circuit.

Transistors T9 and T11 each have one drain-source region coupled to the high voltage source VDD and the other source-drain region coupled to output Q. Similarly, transistor T8 and T10 each have one drain-source region coupled to the high voltage source VDD and the other source-drain region coupled to complementary output QB. An equalization transistor T12 has one drain-source region coupled to output Q and its second drain source region to complementary output QB. The gates of transistors T10, T11 and T12 are coupled to the clock input CLK through an inverter 12.

Transistors T4, T5, T6 and T7 form half of the master latch's interconnected flip flop circuits. Transistors T6 and T7 each have one drain-source region coupled to output Q and the other source-drain region coupled to a data node DATA. Transistors T4 and T5 each have one drain-source region coupled to complementary output QB and the other source-drain region coupled to a complementary data node DATAB. The gates of T5 and T6 are cross coupled to the outputs Q and QB, respectively. The feedback input Q_DUAL from the other half of the master latch is coupled the gates of both T4 and T8. In similar fashion, the complementary feedback input QB_DUAL from the other half of the master latch is coupled the gates of both T7 and T9.

The data input portion of the master latch half circuit includes transistors T0, T1, T2, T3, T13, T14 and T15. The clock input is coupled to the gates of both T13 and T14 through an inverter 14. One drain-source region of each of T13 and T14 is coupled to a low voltage, which is at ground potential GND in the preferred embodiment. The second drain source region of T13 is connected to node N1 and the second drain-source region of T14 is connected to node N2. One drain-source region of each of T3 and T0 is coupled to node N1, and the second drain source regions of T3 and T0 are connected to data nodes DATA and DATAB, respectively. Similarly one drain-source region of each of T2 and T1 is coupled to node N2, and the second drain source regions of T2 and T1 are connected to data nodes DATA and DATAB, respectively. An equalization transistor T15 has one drain-source region coupled to data node DATA and its second drain source region to complementary data node DATAB. The gate of T15 is coupled to the high potential VDD. To complete the circuit, complementary data inputs DIN_0 and DINB_0 are coupled to the gates of transistors T0 and T3, respectively, while dual complementary data inputs DIN_1 and DINB_1 are coupled to the gates of T1 and T2, respectively.

In normal operation, the inputs DIN_0, DIN_1 have the same voltage level, while DINB_0, DINB_1 have the same voltage level that is complementary to DIN_0, DIN_1. When CLK is high, Q, QB are precharged to high through T10, T11 with T12 for equalization. Q_DUAL, QB_DUAL are similar to Q, QB (see FIG. 2) and are precharged to high to turn on T5, T6 and T4, T7, which will precharge DATAB, DATA to high with a weak transistor T15 for equalization. Either T0, T1 or T1, T3 are turned on by the data inputs, hence nodes of N1, N2 are high since T13, T14 are turned on when CLK is high. When CLK transitions to low from high, T13, T14 are turned on and either T0, T1 or T2, T3 are on depending on whether DIN_0, DIN_1 or DINB_0, DINB_1 are high. Hence, either DATAB or DATA will go low to establish a difference voltage drop across the source and drain of the weak transistor T15, which behaves like a high value resistor at this time, between DATAB and DATA. This will turn on T5 or T6 so that QB or Q and similarly QB_DUAL or Q_DUAL will go low. After the states of QB, QB_DUAL and Q, Q_DUAL are latched up by the cross connections between T5 and T6, further changes from the data inputs will not affect the states of Q and QB when CLK is low.

In this innovative scheme of dual complementary inputs, T0, T1, T13 and T2, T3 T14 (see the dashed line box 16 in FIG. 1) are configured to mitigate the SEU effect for the case when CLK transitions from high to low. For a SEU hit, only 1 of 4 inputs will get upset at one time. In the case where DIN_0, DIN_1 are high and DINB_0, DINB_1 are low, all current flows through T0, T1 and T13, T14 while T2, T3 are turned off when CLK transitions to low. Hence, the node voltage of DATAB will be lower than DATA so that QB goes to low while Q stays at high. If there is a negative hit to pull DIN_0 to low during the CLK high-to-low transition time, T0 is turned off but DATAB goes low because DIN_1 stays at high to hold Ti on. Accordingly, the states of QB and Q stay unchanged. Under the same conditions, if there is a positive hit to pull DINB_0 to high during the clock high-to-low transition time, T3 is turned on. However, the total current running through T0 to T1 is 2 times that of the current running through T3 so that DATAB switches to a lower voltage level than DATA, and accordingly, the states of QB and Q remain unchanged.

Figure 2:
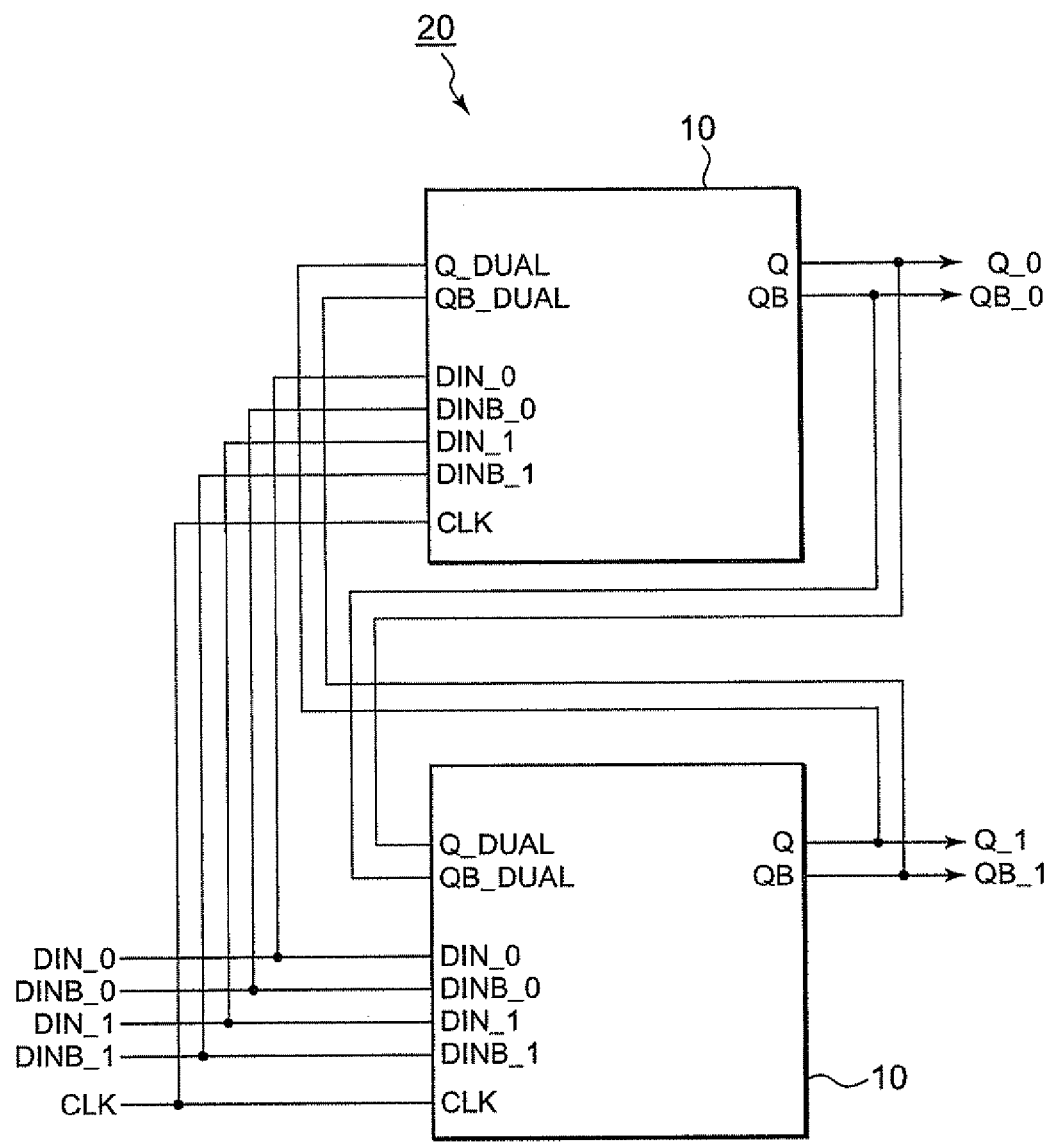
FIG. 2 is a block diagram of a radiation hardened master latch employing two of the half circuits shown in FIG. 1.

FIG. 2 shows the block diagram of a RADHARD master latch 20 that is based on a DICE style connection of two of the half circuits 10 shown in FIG. 1. In the master latch 20 of FIG. 2, the dual complementary data inputs DIN_0, DINB_0, DIN_1 and DINB_1, as well as the clock input CLK, for both of the half circuits are connected together in parallel. The complementary data outputs of each half circuit, Q and QB are cross coupled to the complementary feedback inputs, Q_DUAL and QB_DUAL of the other half circuit in DICE-like fashion to produce dual complementary outputs Q_0, QB_0 and Q_1, QB_1.

Figure 3:
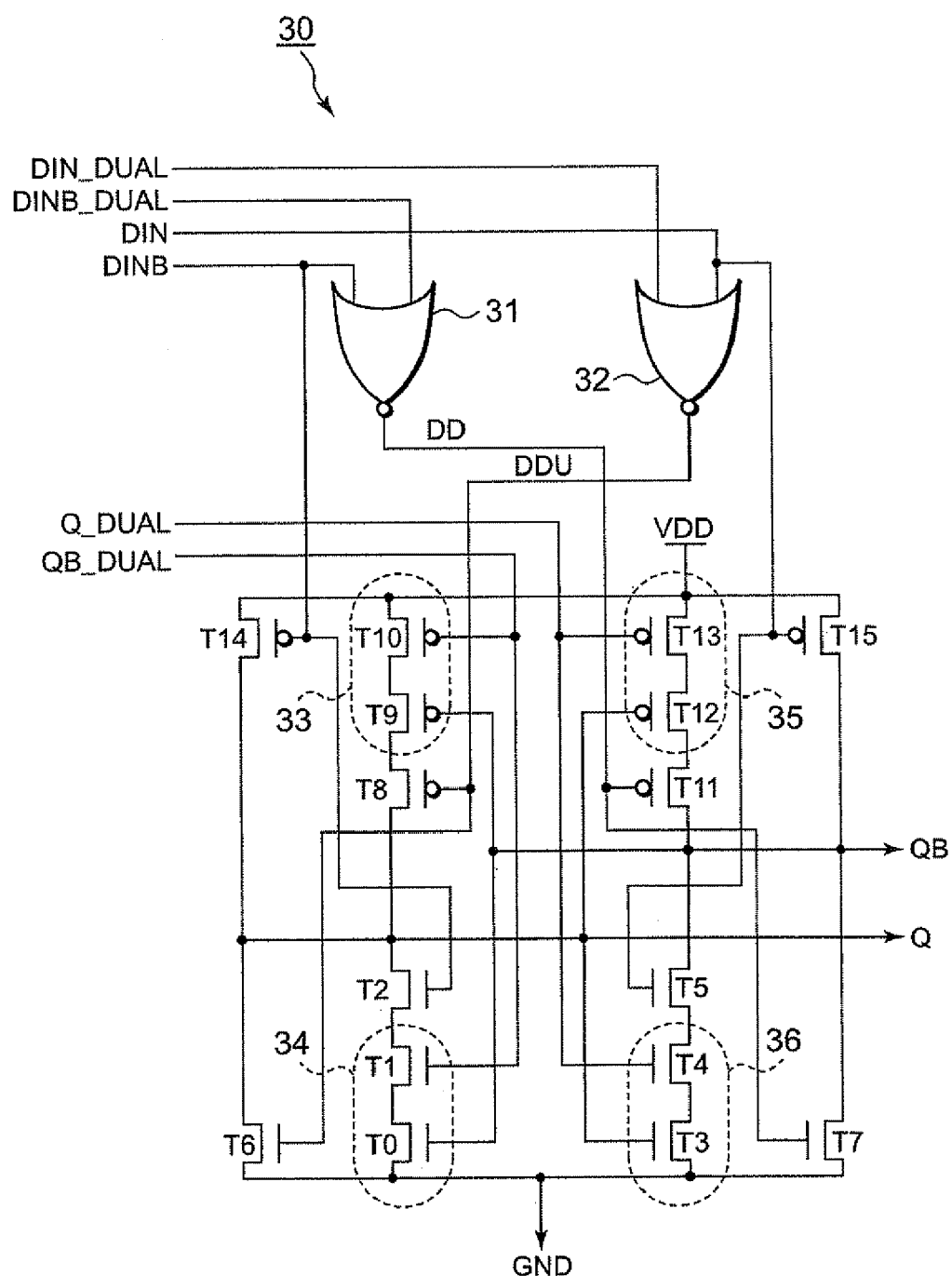
FIG. 3 is a schematic diagram of one half of a radiation hardened slave latch according to the present invention.
Figure 4:
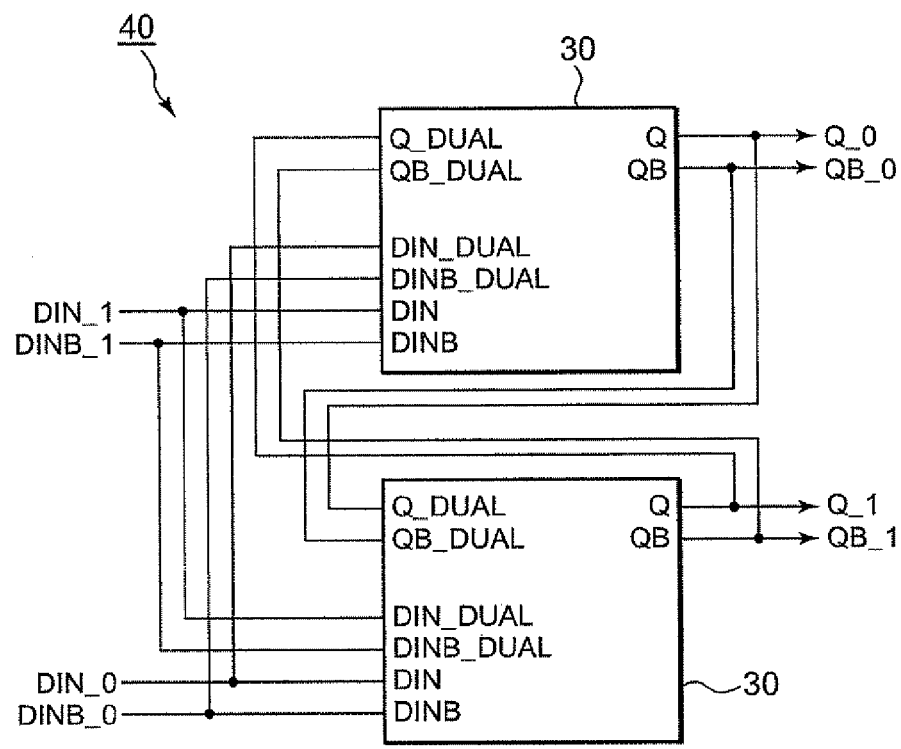
FIG. 4 is a block diagram of a radiation hardened slave latch employing two of the half circuits shown in FIG. 3.

FIG. 3 shows the schematic of one half of a RADHARD slave latch 30 according to the present invention. FIG. 4 shows in block diagram form a RADHARD slave latch 40 which has a DICE style cross-connection between the outputs, Q, QB of each slave latch half circuit and the feedback inputs, Q_DUAL, QB_DUAL of the other slave latch half circuit. In one of the slave latch half circuits, the 4 inputs, DIN, DINB and DIN_DUAL, DINB_DUAL, are fed with input signals DIN_0, DINB_0 and DIN_1, DINB_1, respectively. However, the input connections in the other slave latch half circuit are reversed so that the 4 inputs, DIN, DINB and DIN_DUAL, DINB_DUAL, are fed with input signals DIN_1, DINB_1 and DIN_0, DINB_0, respectively.

As shown in FIG. 3, pairs of dual input signals DIN, DIN_DUAL and DINB, DINB_DUAL are connected to separate NOR gates 31, 32 in the slave latch half circuit to generate signals on lines DDB and DD respectively. The slave latch half circuit includes four output transistors, T6, T7, T14 and T15. One drain-source region of transistor T14 is coupled to a source of high potential VDD, while the second drain-source region of T14 is coupled to output node Q. One drain-source region of transistor T6 is coupled to output node Q, while the second drain-source region of T6 is coupled to a source of low potential, in this case the ground GND. Similarly, output transistors T15 and T7 also form a series pair, with one drain-source region of transistor T15 being coupled to the source of high potential VDD and the second drain-source region of T15 being coupled to output node QB, while one drain-source region of transistor T7 is coupled to output node QB and the second drain-source region of T7 is coupled to the source of low potential GND.

The slave latch half circuit 30 shown in FIG. 3 also includes a series string of three transistors connected in with parallel to each of the output transistors. Specifically, transistor T10 has one drain-source region coupled to the high potential VDD and the other drain-source region coupled to one drain-source region of transistor T9. The other drain-source region of T9 is in turn coupled to one drain-source region of transistor T8, while the other drain-source region of T8 is coupled to output Q. Similarly, transistor T13 has one drain-source region coupled to the high potential VDD and the other drain-source region coupled to one drain-source region of transistor T12. The other drain-source region of T12 is in turn coupled to one drain-source region of transistor T11, while the other drain-source region of T11 is coupled to output QB.

With regard to the transistor string in parallel with T6, transistor T2 has one drain-source region coupled to output Q and the other drain-source region coupled to one drain-source region of transistor T1. The other drain-source region of T1 is in turn coupled to one drain-source region of transistor T0, while the other drain-source region of T0 is coupled to the low potential GND. Similarly, with regard to the transistor string in parallel with T7, transistor T5 has one drain-source region coupled to output QB and the other drain-source region coupled to one drain-source region of transistor T4. The other drain-source region of T4 is in turn coupled to one drain-source region of transistor T3, while the other drain-source region of T3 is coupled to the low potential GND.

The gate connections for the main output transistors and the parallel transistor strings are as follows: input DIN is coupled to the gates of transistors T15 and T5; input DINB is coupled to the gates of transistors T14 and T2; data line DD, at the output of NOR gate 31, is coupled to the gates of transistors T11 and T7; data line DDB, at the output of NOR gate 32, is coupled to the gates of transistors T8 and T6; output Q is coupled to the gates of transistors T12 and T3; output QB is coupled to the gates of transistors T9 and T0; feedback input Q_DUAL, from the other half of the slave latch, is coupled to the gates of transistors T13 and T4; and complementary feedback input QB_DUAL is coupled to the gates of transistors T10 and T1.

In the normal operation of the RADHARD slave latch half circuit 30, when the clock CLK is high, all four inputs, DIN_DUAL, DINB_DUAL, DIN, DINB, are pre-charged to high; all four output transistors, T6, T7, T14, T15 are turned off and all of transistors T5, T8 and T2, T11 are turned on to hold the states of outputs Q and QB. When the clock CLK transitions from high to low, T6, T15, T2, T11 will be turned on and T7, T14, T5, T8 turned off dependent on whether DINB, DINB_DUAL go to high and DIN, DIN_DUAL go to low, or vice versa. The two 2-input NOR gates 31, 32 are implemented to avoid the effect of two node flips with one sensitive node hit, as discussed in the paper by Wang and Gong, cited above.

The innovative scheme implemented in the RADHARD slave latch half circuit 30 shown in FIG. 3 provides a configuration designed to mitigate the possibility of an SEU flipping the states of Q and QB. In this configuration, the gates of transistors T9, T0 and T10, T1 (boxes 33, 34) are connected to QB and QB_DUAL respectively, and the gates of transistors T12, T3 and T13, T4 (boxes 35, 36) are connected to Q and Q_DUAL respectively. During a SEU hit, only one of the four nodes, Q, QB, Q_DUAL and QB_DUAL, will get flipped. When QB, QB_DUAL are low and Q, Q_DUAL are high, if there is a positive hit to pull QB to high when the clock CLK is high, transistor T0 will be turned on and transistor T9 turned off, but transistor T1 is off because QB_DUAL stays at low; hence Q and QB states remain unchanged. Under the same condition, if there is a negative hit to pull Q to low, transistor T12 will be turned on and transistor T3 turned off, but transistor T13 will be off because Q_DUAL stays at high; hence, Q and QB states remain unchanged.

Figure 5:
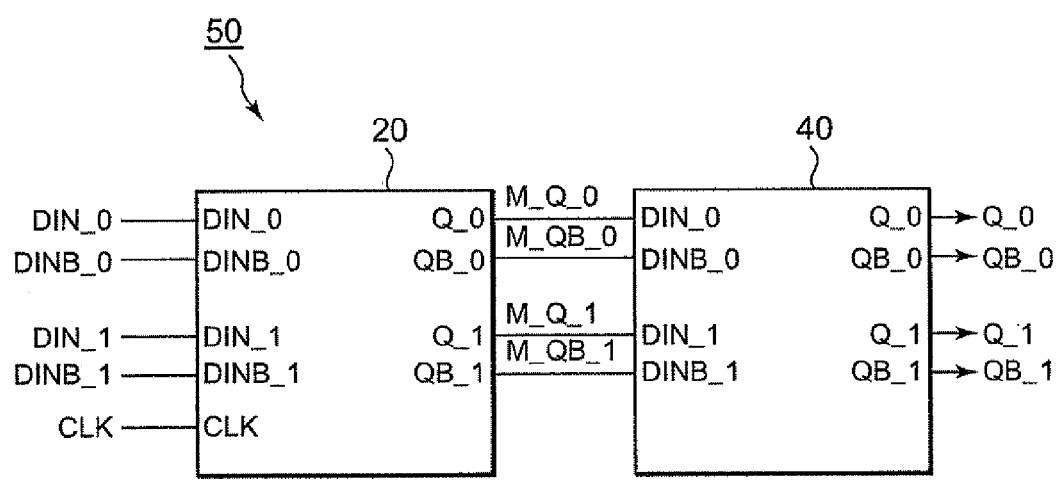
FIG. 5 is a block diagram of a radiation hardened D-type flip flop according to the present invention employing a master latch and a slave latch.

FIG. 5 shows a block diagram of a RADHARD D-type flip flop 50 according to the present invention, which is comprised of the RADHARD master latch 20 of FIG. 2 connected to the RADHARD slave latch 40 of FIG. 4. As shown in FIG. 5, the dual complementary input signals DIN_0, DINB_0, DIN_1 DINB_1 and the clock CLK are connected to the corresponding inputs of the master latch 20. The inputs DIN_0, DINB_0, DIN_1 DINB_1 of the slave latch 40 are connected to the outputs Q_0, QB_0, Q_1 and QB_1 of the master latch through the wires of M_Q_0, M_QB_0 and M_Q_1 and M_QB_1. The outputs Q_0, QB-0, and Q_1, QB_1 of the slave latch 40 are taken as the outputs of the D-type flip flop 50.

Radhard Programmable Frequency Divider Design

Figure 6:
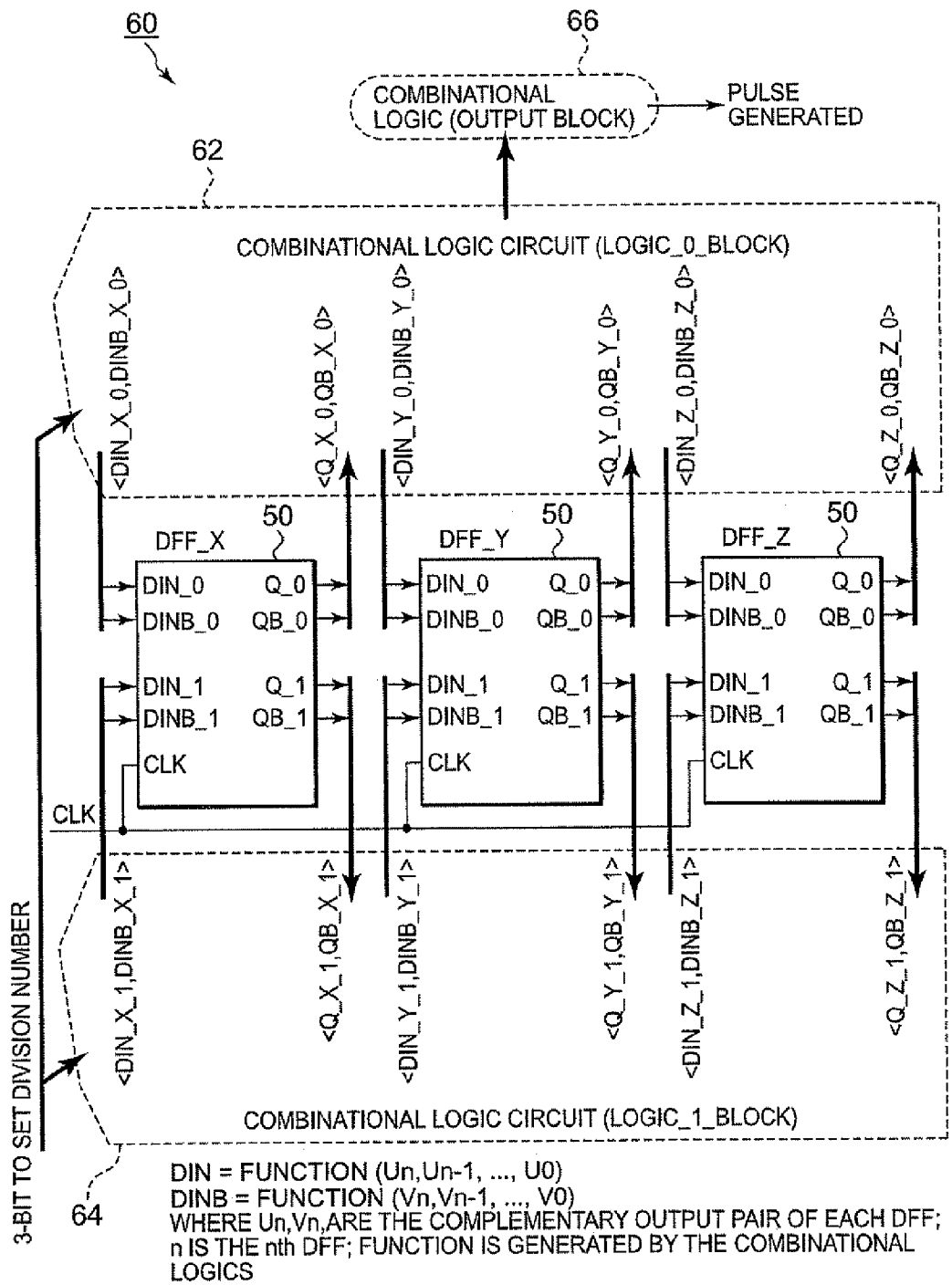
FIG. 6 is a block diagram of a programmable frequency divider according to the present invention employing the radiation hardened D-type flip flops of FIG. 5.

FIG. 6 shows a block diagram of a 3-bit RADHARD PPFD 60 according to the present invention, which incorporates three of the RADHARD DFF's 50 described above and is programmable for divisions from 1 to 8. As shown in FIG. 6, the PPFD also includes two identical combinational logic blocks 62, 64, logic_0 and logic_1. The blocks, logic_0 and logic_1, take the dual complementary outputs, Q_0, QB_0 and Q_1, QB_1 of the three RADHARD DFF's and generate the logic functions as defined in FIG. 6, which are fed back to the complementary inputs DIN_0, DINB_0 and DIN_1 DINB_1 of the RADHARD DFF'S. Since each pair of the complementary inputs of the RADHARD DFF is generated by the complementary signals from the outputs of the three RADHARD DFF'S, the case of two nodes flipped with one SEU hit is avoided. Consider, for example, DIN_Z_0=QB_Y_0+Q_X_0, DINB_C_0=Q_Y_0*QB_X-0 where QB_Y-0, QB_X_0 are high and Q_X_0, Q_Y_0 are low. If there is a negative hit to QB_Y_0 to pull it to low, then DIN_Z_0 goes low while DINB_C_0 is low; since the hit is an SEU hit, DIN_Z_1 stays at high and DINB_Z_1 stays at low. Extrapolated from this example, DIN and DINB can be expressed with the functions shown in FIG. 6:

DIN=Function(Un, Un-1, . . . , U0); and

DINB=Function(Vn, Vn-1, . . . , V0), where Ui and Vi are the complementary outputs of ith DFF.

Hence, if there is an SEU hit to a node in the combinational logic blocks, there will not be a case of two nodes flipped with one hit such that both DIN and DINB get flipped. Therefore, there will always be none or at most one of the 4 inputs getting flipped for each hit. The RADHARD DFF 50 is able to work properly even if there is one of the 4 inputs getting flipped. Consequently, the PPFD 60 employing the above described novel circuit schemes is RADHARD for SEU effects.

As shown in FIG. 6, the first and second combinational logic blocks 62, 64 are capable of providing for frequency division of the clock source in accordance with a specified division number that is inputted. With three DFF's 50, a three bit number can be inputted and division numbers from 1 to 8 are possible. A third combinational logic block 66 is connected to the first combinational logic block 62 for outputting a pulse train representing the clock source frequency divided in accordance with the division number.

Simulation results using PowerSpice™ under conditions representing all combinations of power, voltage and temperature extremes have confirmed that the above-described designs are solid and robust.

Design Structure

Figure 7:
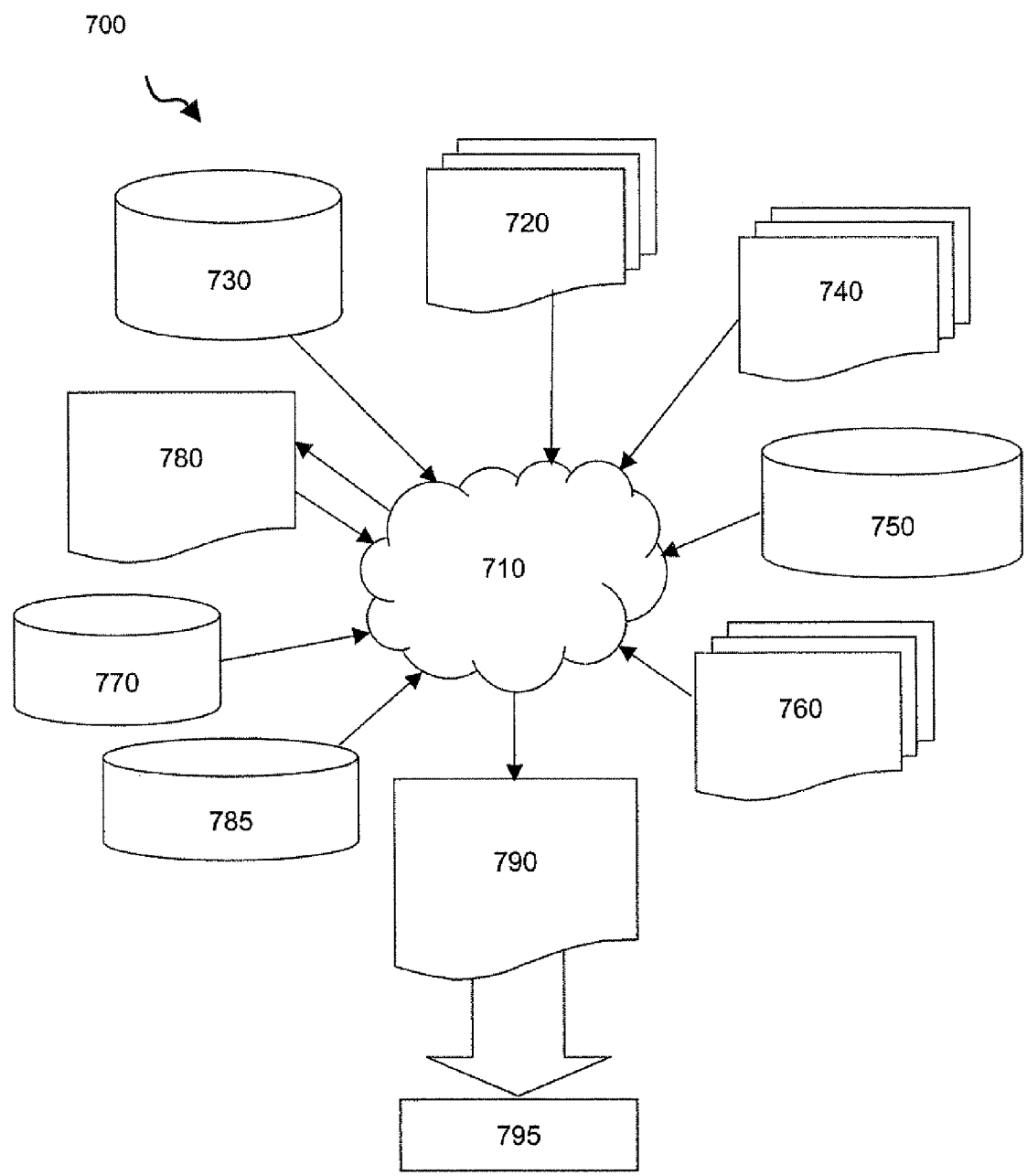
FIG. 7 is a flow diagram of a design process used semiconductor design, manufacture and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 720 is preferably an input to a design process 710 and may come from an IP provider, a core developer, or other design company or may be generated by the operator of the design flow, or from other sources. Design structure 720 comprises circuit 60 in the form of schematics or HDL, a hardware-description language (e.g., Verilog, VHDL, C, etc.). Design structure 720 may be contained on one or more machine readable media. For example, design structure 720 may be a text file or a graphical representation of circuit 60. Design process 710 preferably synthesizes (or translates) circuit 60 into a netlist 780, where netlist 780 is, for example, a list of wires, transistors, logic gates, control circuits, 110, models, etc. that describes the connections to other elements and circuits in an integrated circuit design and recorded on at least one of the machine readable media. This may be an iterative process in which netlist 780 is resynthesized one or more times depending on design specifications and parameters for the circuit.

Design process 710 may include using a variety of inputs; for example, inputs from library elements 730 which may house a set of commonly used elements, circuits, and devices, including models, layouts, and symbolic representations, for a given manufacturing technology (e.g., different technology nodes, 32 nm, 45 nm, 90 nm, etc.), design specifications 740, characterization data 750, verification data 760, design rules 770, and test data files 785 (which may include test patterns and other testing information). Design process 710 may further include, for example, standard circuit design processes such as timing analysis, verification, design rule checking, place and route operations, etc. One of ordinary skill in the art of integrated circuit design can appreciate the extent of possible electronic design automation tools and applications used in design process 710 without deviating from the scope and spirit of the invention. The design structure of the invention is not limited to any specific design flow.

Design process 710 preferably translates an embodiment of the invention as shown in FIGS. 1-6 along with any additional integrated circuit design or data (if applicable), into a second design structure 790. Design structure 790 resides on a storage medium in a data format used for the exchange of layout data of integrated circuits (e.g. information stored in a GDSII (GDS2), GL1, OASIS, or any other suitable format for storing such design structures). Design structure 790 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-6. Design structure 790 may then proceed to a stage 795 where, for example, design structure 790: proceeds to tape-out, is released to manufacturing, is released to a mask house, is sent to another design house, is sent back to the customer, etc.

CONCLUSION

The above-described designs provide the essential techniques for radiation hardening of combinational and sequential logic circuits required to operate at GHz frequencies. The obvious drawbacks of these techniques is larger circuit area and higher power consumption.

It should be understood that the invention is not necessarily limited to the specific process, arrangement, materials and components shown and described above, but may be susceptible to numerous variations within the scope of the invention. For example, although the above-described exemplary aspects of the invention are believed to be particularly well suited for programmable phase frequency dividers typically use in phased-locked loops, it is contemplated that the concepts of the presently disclosed sequential and combinational logic circuits can be used in other RADHARD logic systems requiring the mitigation of SEU events. Moreover, the proposed circuit schemes, while presented in the context of existing CMOS technologies; are device independent and equally applicable to other current and future logic technologies.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. A radiation hardened programmable phase frequency divider comprising:
    a plurality of D-type flip flops each having a clock input, first and second data inputs, first and second complementary data inputs, first and second data outputs, and first and second complementary data outputs;
    a first combinational logic block connected to the first data inputs, first complementary data inputs, first data outputs and first complementary data outputs of the plurality of D-type flip flops; and
    a second combinational logic block identical to the first combinational logic block, and connected to the second data inputs, second complementary data inputs, second data outputs and second complementary data outputs of the plurality of D-type flip flops,
    wherein the clock inputs of the plurality of D-type flip flops are connected to a common clock source.

2. The programmable phase frequency divider of claim 1, wherein the data inputs, DIN, and the complementary inputs, DINB, generated by the first and second combinational logic blocks are related to the data outputs and the complementary data outputs from the D-type flip flops by the equations:

$$DIN = \text{Function}(U_n, U_{n-1}, \ldots, U_0); \text{ and}$$

$$DINB = \text{Function}(V_n, V_{n-1}, \ldots, V_0),$$

where $U_i$ and $V_i$ are respectively the data output and the complementary Data output of the ith D-type flip flop.

3. The programmable phase frequency divider of claim 1, wherein the first and second combinational logic blocks are adapted to provide for frequency division of the clock source in accordance with a division number inputted to the combinational logic blocks.

4. The programmable phase frequency divider of claim 3, further comprising:
    a third combinational logic block connected to the first combinational logic block for outputting a pulse train representing the clock source frequency divided in accordance with the division number.

5. The programmable phase frequency divider of claim 1, wherein each of the plurality of D type flip flops is a radiation hardened D-type flip flop, wherein operation of the D-type flip flop is immune to a single event upset affecting at most one of the four complementary data inputs.

6. The programmable phase frequency divider of claim 5, wherein the plurality of D-type flip flops and the combinational logic blocks are implemented in CMOS technology.

* * * * *